United States Patent
Kuritsyn et al.

(10) Patent No.: US 10,034,362 B2
(45) Date of Patent: Jul. 24, 2018

(54) PLASMA-BASED LIGHT SOURCE

(71) Applicant: KLA-Tencor Corporation, Milpitas, CA (US)

(72) Inventors: Alexey Kuritsyn, San Jose, CA (US); Alexander Bykanov, San Diego, CA (US); Michael Kanouff, Livermore, CA (US); Oleg Khodykin, San Diego, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/838,594

(22) Filed: Aug. 28, 2015

(65) Prior Publication Data
US 2016/0249442 A1 Aug. 25, 2016

Related U.S. Application Data

(60) Provisional application No. 62/092,684, filed on Dec. 16, 2014.

(51) Int. Cl.
*H05G 2/00* (2006.01)
*G03F 7/20* (2006.01)
(52) U.S. Cl.
CPC ............ *H05G 2/003* (2013.01); *G03F 7/20* (2013.01); *H05G 2/008* (2013.01)
(58) Field of Classification Search
CPC .......... G03F 7/20; H05G 2/003; H05G 2/008
See application file for complete search history.

(56) References Cited

U.S. PATENT DOCUMENTS

| | | | |
|---|---|---|---|
| 6,815,700 B2 | 11/2004 | Melnychuk et al. | |
| 7,217,941 B2* | 5/2007 | Rettig | H05G 2/001 134/1.1 |
| 7,247,870 B2 | 7/2007 | Ershov et al. | |
| 7,274,030 B2* | 9/2007 | Hergenhan | B82Y 10/00 250/504 R |
| 7,399,981 B2* | 7/2008 | Cheymol | B82Y 10/00 250/503.1 |
| 7,655,925 B2 | 2/2010 | Bykanov et al. | |

(Continued)

FOREIGN PATENT DOCUMENTS

| | | |
|---|---|---|
| JP | 2010-537424 A | 12/2010 |
| WO | 2009025557 | 2/2009 |
| WO | 2014120985 A1 | 8/2014 |
| WO | 2014127151 A1 | 8/2014 |

OTHER PUBLICATIONS

PCT International Search Report from Application No. PCT/US2015/065896 dated May 4, 2016, 4 pages.

(Continued)

*Primary Examiner* — Wyatt Stoffa
(74) *Attorney, Agent, or Firm* — Suiter Swantz pc llo

(57) ABSTRACT

The present disclosure is directed to plasma-based light sources. Systems and methods are described for protecting components of the light source from plasma generated debris which can include target material gas, atomic vapor, high energy ions, neutrals, micro-particles, and contaminants. Particular embodiments include arrangements for reducing the adverse effects of plasma generated ions and neutrals on light source components while simultaneously reducing in-band light attenuation due to target material gas and vapor.

45 Claims, 7 Drawing Sheets

(56) References Cited

U.S. PATENT DOCUMENTS

| | | | |
|---|---|---|---|
| 7,671,349 B2 | 3/2010 | Bykanov et al. | |
| 8,519,366 B2 | 8/2013 | Bykanov et al. | |
| 2006/0043319 A1 | 3/2006 | Gaebel et al. | |
| 2008/0210889 A1 | 9/2008 | Suganuma et al. | |
| 2010/0032590 A1 | 2/2010 | Bykanov et al. | |
| 2012/0050706 A1* | 3/2012 | Levesque | B82Y 10/00 355/55 |
| 2012/0305810 A1 | 12/2012 | Ershov et al. | |
| 2014/0103229 A1 | 4/2014 | Chroback et al. | |
| 2014/0306115 A1* | 10/2014 | Kuritsyn | G02B 27/0006 250/358.1 |
| 2014/0374611 A1* | 12/2014 | Hale | G01N 21/956 250/372 |
| 2015/0076359 A1* | 3/2015 | Bykanov | H05G 2/008 250/372 |
| 2016/0073486 A1* | 3/2016 | Teramoto | H05G 2/005 250/504 R |
| 2016/0345419 A1* | 11/2016 | Teramoto | H05G 2/005 |

OTHER PUBLICATIONS

International Search Report from International Patent Appl. No. PCT/US2015/065896, dated May 4, 2016, in 4 pages.

Brandt, David C. et al., "LPP EUV Source Development for HVM", Proc. SPIE 6517, Emerging Lithographic Technologies XI, 65170Q, Mar. 19, 2007; doi: 10.1117/12.713279; http://dx.doi.org/10.1117/12.713279.

Elg, Daniel Tyler, "Magnetic Mitigation of Energetic Ions for Extreme Ultraviolet Lithography Sources", Thesis, 2013, Urbana, Illinois. https://www.ideals.illinois.edu/bitstream/handle/2142/44169/Daniel_Elg.pdf?sequence=1.

Hansson, Bjorn A. M., "Laser-Plasma Sources for Extreme-Ultraviolet Lithography", Doctoral Thesis, Nov. 2003, Stockholm, Sweden. http://www.diva-portal.org/smash/get/diva2:9513/FULLTEXT01.pdf.

Brauner, Thomas, "Particle Emission from Extreme Ultraviolet Light Sources", Dissertation, Nov. 3, 2008, Friedrich-Schiller-Universitat Jena.

Amano, Sho, "Laser-Plasma Extreme Ultraviolet Source Incorporating a Cryogenic Xe Target", Laboratory of Adavanced Science and Technology for Industry, 2011, University of Hyogo, Japan.

Anscombe, Nadya, "Extreme Competition", Electro Optics, https://www.cymer.com/files/pdfs/Technology/EUV_In_The_News/extreme_competition.pdf.

Mikolajczyk, J., et al., "System for calibration of EUV detectors", Photonics Letters of Poland, vol. 1 (2), 70-72 (2009). http://photonics.pl/PLP/index.php/letters/article/viewFile/1-24/26.

* cited by examiner

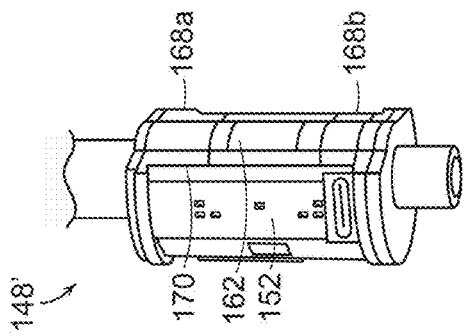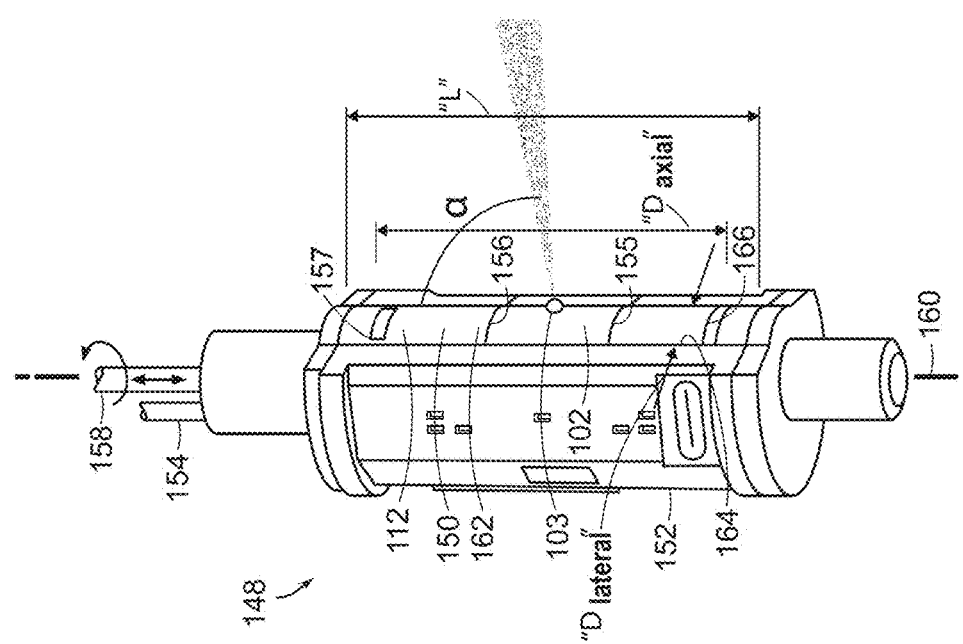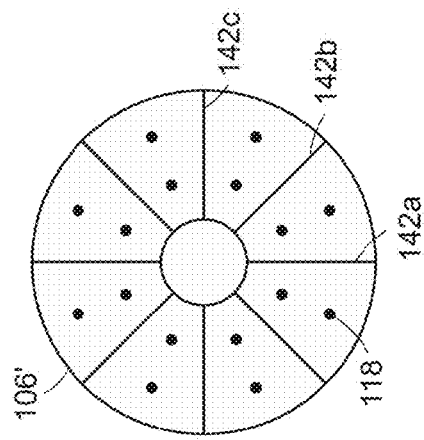

PLASMA-BASED LIGHT SOURCE

PRIORITY

The present application claims priority under 35 U.S.C. 119(e) to U.S. Provisional Patent Application Ser. No. 62/092,684, titled Gas Management System for an EUV Light Source, by Alexey Kuritsyn et al., filed Dec. 16, 2014. The above-referenced provisional patent application is hereby incorporated by reference in its entirety.

TECHNICAL FIELD

The present disclosure relates generally to plasma-based light sources for generating light in the vacuum ultraviolet (VUV) range (i.e. light having a wavelength of approximately 100 nm-200 nm), extreme ultraviolet (EUV) range (i.e. light having a wavelength in the range of 10 nm-124 nm and including light having a wavelength of 13.5 nm) and/or soft X-ray range (i.e. light having a wavelength of approximately 0.1 nm-10 nm). Some embodiments described herein are high brightness light sources particularly suitable for use in metrology and/or mask inspection activities, e.g. actinic mask inspection. More generally, the plasma-based light sources described herein can also be used (directly or with appropriate modification) as so-called high volume manufacturing (HVM) light sources for patterning chips.

BACKGROUND

Plasma-based light sources, such as laser-produced plasma (LPP) sources and discharge-produced plasma (DPP) sources, are often used to generate soft X-ray, extreme ultraviolet (EUV), and/or vacuum ultraviolet (VUV) light for applications such as defect inspection, photolithography, or metrology. In overview, in these plasma light sources, light having the desired wavelength is emitted by plasma formed from a target material having an appropriate line-emitting or band-emitting element, such as Xenon, Tin, Lithium or others. For example, in an LPP source, a target material is irradiated by an excitation source, such as a laser beam, to produce plasma, and in a DPP system, a target material is excited by an electrical discharge, for example using electrodes, to produce plasma.

For these sources, the light emanating from the plasma is often collected via a reflective optic, such as a collector optic (e.g. a near-normal incidence or grazing incidence mirror). The collector optic directs, and in some cases focuses, the collected light along an optical path to an intermediate location where the light is then used by a downstream tool, such as a lithography tool (i.e. stepper/scanner), a metrology tool or a mask/pellicle inspection tool.

During operation of the plasma-based illumination system, debris such as target material gas, atomic vapor, high energy ions, neutrals, micro-particles, and/or contaminants (e.g. hydrocarbons or organics) may be emitted from various sources including, but not limited to, the target material, plasma site, plasma-facing components, eroded surfaces in proximity of the target material or the plasma, a target-forming structure, and/or any other component within a plasma-based light source. These debris can sometimes reach the reflective optic, or other components, such as a laser input window or diagnostic filters/detectors/optics, and degrade their performance and/or cause irreparable damage. In addition, high energy ions, neutrals and other micro-particles emitted by the plasma can erode/sputter light source components creating further debris that can interfere with the efficient operation of the light source.

In addition to damaging light source components, the plasma generated debris, and especially the gas/atomic vapor can undesirably attenuate light emitted by the plasma. For example, for an EUV source, where Xenon is used as a target material, the introduction of a buffer gas (e.g. for ion stopping or light source temperature control) may lead to significant losses in EUV transmission due to Xenon gas, which strongly absorbs EUV light, and mixes with the buffer gas. In more quantitative terms, the light transmission of 13.5 nm EUV light through 1 Torr*cm (pressure*distance) of Xenon gas at room temperature is ~44%, while the light transmission of 13.5 nm EUV light through 1 Torr*cm of Argon is ~96%.

The use of coils has been suggested to protect a reflective optic by deflecting charged particles using magnetic fields. However, coils producing magnetic fields require significant design complexity, are expensive, and are only capable of deflecting ions. Thus, the use of magnetic fields is ineffective in stopping neutrals (and neutral particles), which are often produced when ions undergo charge exchange with a buffer gas.

With the above in mind, Applicants disclose a Plasma-based Light Source and corresponding methods of use.

SUMMARY

In a first aspect, a device is disclosed having a system generating plasma from a target material at a plasma site in a chamber, the plasma producing radiation traveling along an optical pathway toward an intermediate location, and producing target material gas and ions exiting the plasma. The device also includes a component distanced from the site by a closest distance, d, and a flowing gas disposed between the plasma and the component, the gas establishing an average gas pressure, P, over the distance, d, sufficient to reduce ion energy below 100 eV before the ions reach the component. Also, for this aspect, the device includes at least one outlet configured to receive buffer gas flowing from a fluidically coupled gas source and at least one pump removing gas from the chamber, the pump and outlet cooperating to reduce target material gas concentration along the pathway from the plasma to the intermediate location.

In one embodiment of this aspect, the component is a near normal incidence mirror reflecting EUV radiation from the plasma site to the intermediate location.

In a particular embodiment, the device can include a flow directing structure such as a tubular flow guide and/or one or more vanes positioned between the near normal incidence mirror and the plasma site to direct flow from the at least one outlet, for example, in a selected flow direction.

For this aspect, the component can be a mirror, laser input window, diagnostic filter, detector or optic, a vane, a tubular flow guide directing flow from the collector optic, a flow guide directing flow at the intermediate location or any other component that may be damaged by ions/neutrals or sputtered by ions/neutrals to create unwanted debris.

The device can be used to produce VUV, EUV, and/or soft X-ray radiation.

In one implementation, the buffer gas has a higher EUV transmission than the target material gas, e.g. Xenon gas. For example, the buffer gas can be Hydrogen, Helium, HBr, Argon, Nitrogen or combinations thereof.

For this aspect, the system can be a laser produced plasma (LPP) system having a drive laser irradiating target material or a discharge produced plasma (DPP) system. When an LPP system is employed, the system can irradiate a target material jet or stream, target material droplets, pellets or target material that is coated on a surface of a rotatable, cylindrically-symmetric element.

In one embodiment of this aspect, the at least one outlet is configured to actively flow buffer gas toward the plasma at a controlled flow rate.

In a particular embodiment, the at least one outlet cooperates with the pump to produce a transversely directed flow between the component and the plasma site to push target material debris out of the optical pathway.

In some implementations, the device can further include a flow guide at the intermediate location with the at least one outlet directing buffer gas into the flow guide to reduce the concentration of target material gas from the optical pathway. For example, the flow guide can be tubular, and in some cases can be conically shaped. In some setups, e.g. when a target material that is coated on a surface of a rotatable, cylindrically-symmetric element is used, the flow guide can be sized and positioned out of the plasma line of site. With this arrangement, fast ions from the plasma cannot directly reach (i.e. on a straight line path from the plasma) the flow guide.

In another aspect, a device is disclosed herein that includes a system generating plasma from a target material at a plasma site in a chamber, the plasma producing radiation and ions exiting the plasma and a component distanced from the plasma site by a closest distance, d. For this aspect, the device also includes at least one outlet configured to introduce a buffer gas into the chamber and at least one pump assembly removing gas from the chamber. Also for this aspect, the pump assembly has a pump and a conductance control aperture plate positioned upstream of the pump. With this arrangement, the pump assembly can cooperate with the at least one outlet to establish a flowing gas between the plasma and the component having an average gas pressure, P, over the distance, d, sufficient to reduce ion energy below 100 eV before the ions reach the component.

With this arrangement, the conductance control aperture plate operates to establish a pressure, p, at the pump inlet that is less than the pressure, P, in the chamber between the plasma and the component (i.e. p<P). For example, a pressure, p, at the pump inlet can be established that allows for efficient pump operation.

In a particular embodiment, a baffle can be positioned between the conductance control aperture plate and the pump. The baffle can be positioned to reduce the formation of a gas jet by the conductance control aperture plate. Instead of, or in addition to a baffle, the pump inlet can be positioned at a sufficient distance from the conductance control aperture plate, e.g. using a spacer or inlet extension, to prevent any gas jet formed by the conductance control aperture plate from interfering with the pump.

In one embodiment, a subsystem for controlling vacuum pump conductance includes a conductance control plate that is formed with an aperture and a mechanism for adjusting the size of the aperture.

In another embodiment, a subsystem for controlling vacuum pump conductance includes a conductance control plate that is spaced from a line inlet to establish a gap between the plate and line inlet and a mechanism for moving the conductance control plate relative to the line inlet to adjust the size of the gap.

In one embodiment of this aspect, the at least one pump assembly cooperates with the outlet to establish a flowing gas between the plasma and the component having an average gas pressure, P, over the distance, d, sufficient to reduce ion energy below 30 eV before the ions reach the component.

In a particular embodiment of this aspect, the plasma produces radiation traveling along an optical pathway toward an intermediate location, and produces target material gas and the device further includes at least one outlet that is configured to receive buffer gas flowing from a fluidically coupled gas source and cooperate with at least one pump removing gas from the chamber to reduce the concentration of target material gas along the pathway from the plasma to the intermediate location.

The at least one outlet can be configured to actively flow gas towards a source of debris and away from the reflective optic and/or any other protected surface at a controlled flow rate. For example, outlet(s) may be configured to flow gas directly against debris such as, but not limited to, atomic vapor, gas, ions, neutrals, micro-particles, or contaminants (e.g. hydrocarbons or organics) emitted from a target material, plasma site, plasma-facing components, eroded surfaces in proximity of the target material or the plasma, a target-forming structure, and/or any other component within the vacuum chamber.

In some embodiments, the at least one outlet may include openings formed within or near a collector mirror. Additional/alternative embodiments are described below in the detailed description, and those skilled in the pertinent art will further appreciate that the embodiments or portions of the embodiments described herein may be combined or modified without departing from the scope of this disclosure.

In still another aspect, a device is disclosed herein that includes a cylindrically-symmetric element that is rotatable about an axis and has a surface coated with a band of plasma-forming target material, the band extending from a first edge to a second edge and establishing a target region for interaction between the plasma-forming target material and a drive laser. For the device, a housing is provided overlying the surface and formed with an opening to expose plasma-forming target material for irradiation by the drive laser to produce plasma, the opening extending beyond at least one of the first and second edges of the band to distance an edge of the housing from the plasma.

In one embodiment of this aspect, the housing is constructed to conform with the shape of the cylindrically-symmetric element.

In one particular embodiment, the housing has a length, L, parallel to the rotation axis and the opening extends greater than 50 percent of the length of the housing ($D_{axial} > 0.5$ L).

In some setups, the opening can extend in the lateral direction from a first edge to a second edge with each edge positioned to not be within a direct line of sight of the plasma.

In one embodiment, the opening has a length, $D_{axial}$ in a direction parallel to the axis of the cylindrically-symmetric element and a width, $D_{lateral}$ in a direction normal to the axis, with $D_{axial} > D_{lateral}$.

In one implementation, the device can include a gas management system having a gas supply subsystem configured to supply plasma-forming target material to the surface of the rotatable, cylindrically-symmetric element. For example, the plasma-forming target material can include frozen Xenon. For this aspect, the device can include a mechanism to rotate the cylindrically-symmetric element about the axis and translate the cylindrically-symmetric element along the axis.

In one arrangement, the target material support system can include one or more cover plates, with each plate overlying a portion of the housing opening and attached to the housing on one or both sides of the opening using one or more fasteners to allow in situ replacement of a damaged cover plate.

In another aspect, an EUV light source is described having a system generating plasma from a Xenon target material at a plasma site in a chamber, the plasma producing radiation traveling along an optical pathway toward an intermediate location, the plasma producing ions exiting the plasma and wherein the system introduces between 0.4 standard liters per minute (slm) and 4.0 slm of Xenon target material gas into the chamber. The EUV light source also includes a component distanced from the plasma site by a closest distance, d, and a flowing gas disposed between the plasma and the component, the gas establishing an average gas pressure, P, over the distance, d, sufficient to reduce ion energy below 100 eV before the ions reach the component. In addition, for this aspect, the EUV light source includes at least one outlet configured to receive buffer gas flowing from a fluidically coupled gas source; and at least one pump removing gas from the chamber, the pump and outlet cooperating to reduce Xenon target material gas concentration along the optical pathway from the plasma to the intermediate location.

In a particular embodiment of this aspect, the component is a mirror reflecting EUV radiation from the plasma site to the intermediate location and the at least one outlet establishes a buffer gas flow rate between 0.5 standard liters per minute (slm) and 20.0 slm away from the mirror.

In some embodiments, a light source as described herein can be incorporated into an inspection system such as a mask inspection system. In an embodiment, for example, an inspection system may include a light source delivering radiation to an intermediate location, an optical system configured to illuminate a sample with the radiation, and a detector configured to receive illumination that is reflected, scattered, or radiated by the sample along an imaging path. The inspection system can also include a computing system in communication with the detector that is configured to locate or measure at least one defect of the sample based upon a signal associated with the detected illumination.

In some embodiments, a light source as described herein can be incorporated into a lithography system. For example, the light source can be used in a lithography system to expose a resist coated wafer with a patterned beam of radiation. In an embodiment, for example, a lithography system may include a light source delivering radiation to an intermediate location, an optical system receiving the radiation and establishing a patterned beam of radiation and an optical system for delivering the patterned beam to a resist coated wafer.

It is to be understood that both the foregoing general description and the following detailed description are exemplary and explanatory only and are not necessarily restrictive of the present disclosure. The accompanying drawings, which are incorporated in and constitute a part of the specification, illustrate the subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 3A is a simplified schematic diagram as seen along line 3A-3A in FIG. 3 illustrating radially oriented flow directing vanes;

FIG. 4 is a perspective view of a target material support system having a rotatable cylindrically-symmetric element with a surface coated with a plasma-forming target material and a housing overlying the surface wherein the housing is formed with an opening to expose the plasma-forming target material for irradiation by a drive laser to produce plasma;

FIG. 4A is a perspective view of another embodiment of a target material support system having a pair of cover plates, with each plate overlying a portion of the housing opening and attached to the housing on each side of the opening by fasteners to allow in situ replacement of a damaged cover plate.

DETAILED DESCRIPTION

Reference will now be made in detail to the subject matter disclosed, which is illustrated in the accompanying drawings.

Figure 1:
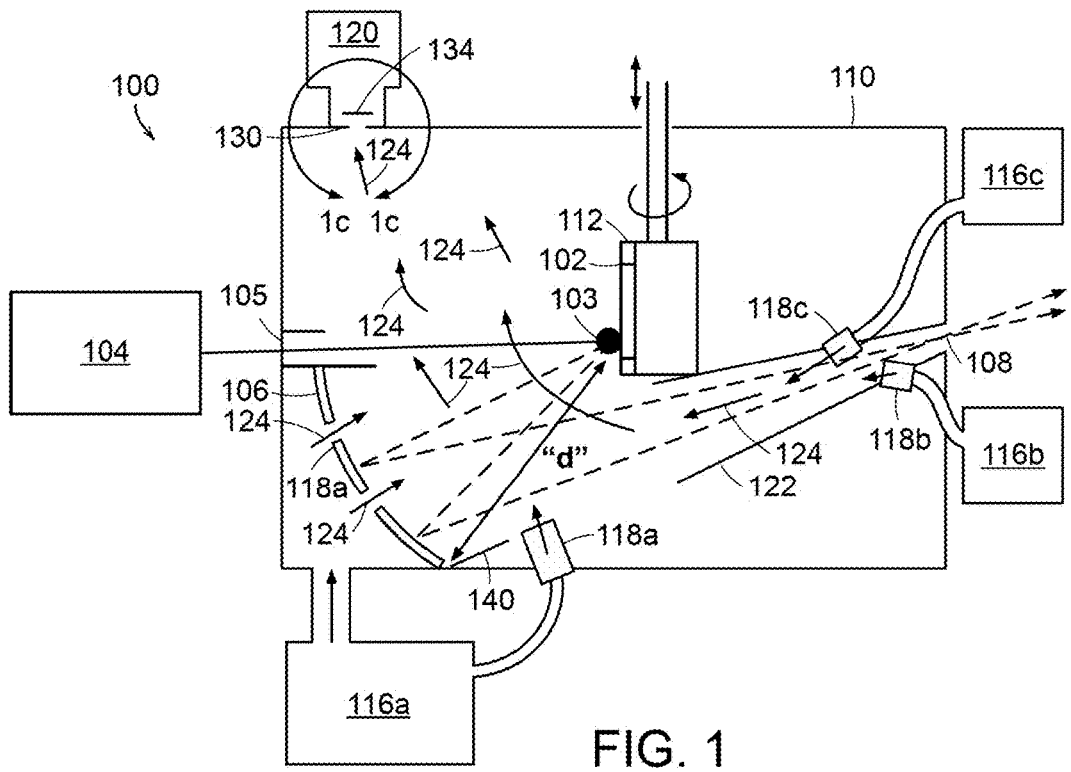
FIG. 1 is a simplified schematic diagram illustrating an LPP light source having a target material coated on a rotatable, cylindrically symmetric element and an arrangement for controlling gas flows and gas pressures to protect light source components from plasma generated ions and neutrals and for reducing in-band light transmission due to target material gas and vapor in accordance with an embodiment of this disclosure.

FIG. 1 shows an embodiment of a light source (generally designated 100) for producing soft X-ray, EUV, or VUV light and having an arrangement for the establishment and maintenance of gas pressures sufficient to protect light source components from plasma generated ions and neutrals and for controlling gas flows to reduce in-band light transmission due to target material gas and vapor. For example, the light source 100 may be configured to produce in-band EUV light (e.g. light having a wavelength of 13.5 nm with 2% bandwidth). As shown, the light source 100 includes an excitation source 104, such as a drive laser, configured to irradiate a target material 102. In some cases, the target material 102 may be irradiated by a first pulse (pre-pulse) followed by a second pulse (main pulse) to produce plasma. As an example, for a light source 100 that is configured for actinic mask inspection activities, an excitation source 104 consisting of a pulsed drive laser having a solid state gain media such as Nd:YAG outputting light at approximately 1 μm and a target material 102 including Xenon may present certain advantages in producing a relatively high brightness EUV light source useful for actinic mask inspection. Other drive lasers having a solid state gain media such as Er:YAG, Yb:YAG, Ti:Sapphire or Nd:Vanadate may also be suitable. On the other hand, for high volume manufacturing (HVM) activities such as photolithography, an excitation source 104 consisting of a drive laser having a high power gas-discharge $CO_2$ laser system with multiple amplification stages and outputting light at approximately 10.6 μm and a target material 102 including Tin may present certain advantages including the production of in-band EUV light with relatively high power with good conversion efficiency. Alternatively, in a discharge-produced plasma source (not shown), the excitation source may include, but is not limited to, electrodes configured to excite the target material by producing an electrical discharge.

Continuing with reference to FIG. 1, for the light source 100, the excitation source 104 is configured to irradiate the target material 102 at a plasma site 103 within a chamber 110 with a beam of illumination or a train of light pulses delivered through a laser input window 105. As shown, some of the light emitted from the plasma, e.g. soft X-ray, EUV, or VUV light, travels along an optical pathway from the plasma site 103 to intermediate location 108. More specifically, the light travels from the plasma site 103 to the collector optic 106, e.g. near normal incidence mirror, where it is reflected to an intermediate location 108.

For the embodiment shown in FIG. 1, the target material 102 is coated on a rotatable, cylindrically-symmetric element 112 which is described in more detail below with reference to FIG. 4. In an embodiment, the rotatable, cylindrically-symmetric element 112 can be cooled and coated with Xenon ice target material. The target material 102 may include, but is not necessarily limited to, a material that includes Tin, Lithium, Xenon or combinations thereof. Those skilled in the art will appreciate that various target materials and deposition techniques may be used without departing from the scope of this disclosure.

FIG. 1 further shows that the collector optic 106 can be located off-axis from the irradiation path between the laser input window 105 and plasma site 103. As shown, the collector optic 106 is located at a closest distance, "d" from the plasma site 103. The collector optic 106 may be configured to receive soft X-ray, EUV, or VUV emissions from the resulting plasma and directionally reflect, and for the embodiment shown in FIG. 1, focus the soft X-ray, EUV, or VUV illumination towards an intermediate location 108. For the embodiment shown in FIG. 1, the collector optic 106 can be a near-normal incidence collector mirror having a reflective surface in the form of an off-axis portion of a truncated prolate spheroid (i.e., an ellipse rotated about its major axis), which can include a graded multi-layer coating with alternating layers of Molybdenum and Silicon, and can include excess sacrificial Molybdenum/Silicon layers, and in some cases one or more high temperature diffusion barrier layers, smoothing layers, capping layers and/or etch stop layers. In some embodiments, the reflective surface of the collector optic has a surface area in the range of approximately 100 and 10,000 $cm^2$ and may be disposed approximately 0.1 to 2 meters from the plasma site 103. Those skilled in the art will appreciate that the foregoing ranges are exemplary and that various optics may be used in place of, or in addition to, the prolate spheroid mirror for collecting and directing light to an intermediate location 108 for subsequent delivery to a device utilizing soft X-ray, EUV, or VUV illumination, such as an inspection system or a photolithography system.

As shown in FIG. 1, the light source 100 includes an arrangement for the establishment and maintenance of gas pressures sufficient to protect light source components from plasma generated ions and neutrals and for controlling gas flows to reduce in-band light transmission due to target material gas and vapor. The protected components can include the collector optic 106, or any other protected surface such as, but not limited to, a laser input window 105, a chamber observation window (not shown), a diagnostic filter/detector/optic (not shown), a vane or a tubular flow guide (described below), portions or all of a target delivery system or the chamber wall. For the light source 100 shown, the arrangement includes one or more outlets 118a-c configured to actively flow buffer gas from respective fluidically coupled buffer gas sources 116a-c in predetermined directions (it is to be appreciated that the three gas sources 116a-c could be single gas source feeding the outlets via manifold) and a vacuum pump 120 removing gas from the chamber 110. These flows can establish and maintain 1) a flowing gas between the plasma site 103 and the collector optic 106 having an average gas pressure, P, over the distance, "d", sufficient to reduce ion energy (e.g. due to collisions between the ions and buffer gas molecules) to a target maximum energy level (e.g. below 100 eV, and in some cases below 30 eV), before the ions reach the collector optic 106, and 2) a reduced target material gas concentration along the optical pathway from the plasma site 103 to the intermediate location 108. In some cases, these flows can establish a flowing buffer gas at a gas number density, n, between the plasma site 103 and collector optic 106, with the gas number density, n, being sufficient to protect the collector optic 106 from substantially all plasma emitted ions.

The selection of the buffer gas composition and pressure can be selected based on the ion stopping power of the buffer gas composition and the in-band light absorption of the buffer gas as a function of pressure (e.g. to provide an acceptable in-band absorption for the particular light of interest (soft X-ray, VUV or EUV)) over the distance the light needs to travel from the plasma site 103 to the intermediate location 108. The required flowing buffer gas pressure can be calculated, for example, by measuring the distribution of ion energies (in the absence of buffer gas) for the particular drive laser/target material configuration, for example, using a Faraday Cup such as (Model FC-73A from Kimball Physics). With these ion energies, publicly available software such as SRIM (Stopping and Range of Ions in Matter) software (available at the website www*srim*org) can be used to determine the gas pressure (operable over a given distance, "d") that is required to reduce the energy of an ion (having an initial ion energy) to below a selected maximum energy level. For example, the ion-slowing gas pressure can be implemented as an average of the gas pressure, P over the distance, "d".

For the light source 100 in a steady-state regime, the chamber pressure is primarily determined by the balance of the gas throughput and the pumping speed of the vacuum pump(s) 120. For example, maximum working pressure of an Edwards turbo-molecular pump model STP-iXA3306 is about 15 mT. Aperture (conductance control) plates 130 can be used to control conductance of the vacuum pump(s) 120 and allow for controlled change (increase) of the gas pressure in the chamber 110 independently of the gas flow. This capability to raise chamber pressure allows for positioning collector optic 106 closer to the plasma site 103, since one can now achieve the buffer gas p*d (pressure*distance) required for stopping collector erosion by increasing chamber pressure. For example, according to measurements and numerical calculations made by Applicants, the p*d required to stop 2 keV Xenon ions or neutrals coming from an EUV emitting plasma using an Argon buffer gas, lays in the range of 1-2 Torr*cm. Therefore, one can expect to need up to about 20 mTorr of buffer gas pressure for a collector optic 106 positioned 100 cm from plasma site 103 and up to about 50 mTorr for a collector optic 106 positioned 40 cm from the plasma site 103. It is to be appreciated that the total required flow of protection gas depends on a number of factors including, the number of available vacuum pump(s) 120 and their characteristics such as pumping speed, the cross sectional area of the pump, as well as the desired chamber pressure. Positioning the collector optic 106 closer to the plasma site 103 has a number of advantages. For one, it makes collector optic 106 manufacturing easier and cheaper, since for a given collection angle the collector optic 106 area scales proportionally to the distance squared ($\sim r^2$). Also, overall light source chamber size can be made smaller as well resulting in a smaller light source footprint. In addition, having higher chamber pressure is also beneficial for protecting plasma facing components located in the vicinity of the plasma (like the drum housing in the case of drum-based light source described below with reference to FIG. 4), since higher p*d will lead to more efficient stopping of the energetic ions and therefore help to prevent erosion.

As indicated above, in addition to the establishment and maintenance of gas pressures sufficient to protect light source components from plasma generated ions and neutrals and for controlling gas flows, an arrangement of outlet(s) 118*a-c* and vacuum pump(s) 120, such as the arrangement shown in FIG. 1, can be used to increase in-band light transmission by reducing the concentration of target material gas and vapor on the optical path (i.e. the path from the plasma site 103 to the collector optic 106 and then on to the intermediate location 108). The light source 100 can also include a tubular flow guide 140 bounding the outer edge of the collector optic 106 to reduce flow expansion (e.g. prevent gas from expanding outwards beyond the outer edge of the reflective optic 106, where the tubular flow guide 140 may be dimensioned and arranged so that it does not block the optical path). U.S. patent application Ser. No. 14/247,082, titled "Debris Protection System for Reflective Optic Utilizing Gas Flow", to Kuritsyn et al., filed Apr. 7, 2014 and U.S. patent application Ser. No. 14/497,506, titled "System And Method for Producing an Exclusionary Buffer Gas Flow in an EUV Light Source", to Bykanov et al., filed Sep. 26, 2014 disclose applicable example arrangements for providing gas flows in plasma-based light sources. U.S. patent application Ser. No. 14/247,082 and U.S. patent application Ser. No. 14/497,506 are hereby incorporated by reference herein, in their entirety.

FIG. 1 shows that the light source 100 can include a flow guide 122 at the intermediate location 108 for directing buffer gas flow from outlets 116*a,b* to reduce the concentration of target material gas from the optical pathway. For example, the flow guide 122 can be conically shaped and for the setup shown in FIG. 1 which employs a target material that is coated on a surface of a rotatable, cylindrically-symmetric element, the flow guide 122 can be sized and positioned out of the plasma line of site (i.e. out of the line of sight of the plasma site 103). With this arrangement, ions and neutrals from the plasma cannot directly reach (i.e. on a straight line path from the plasma) the flow guide 122.

Figure 1A:
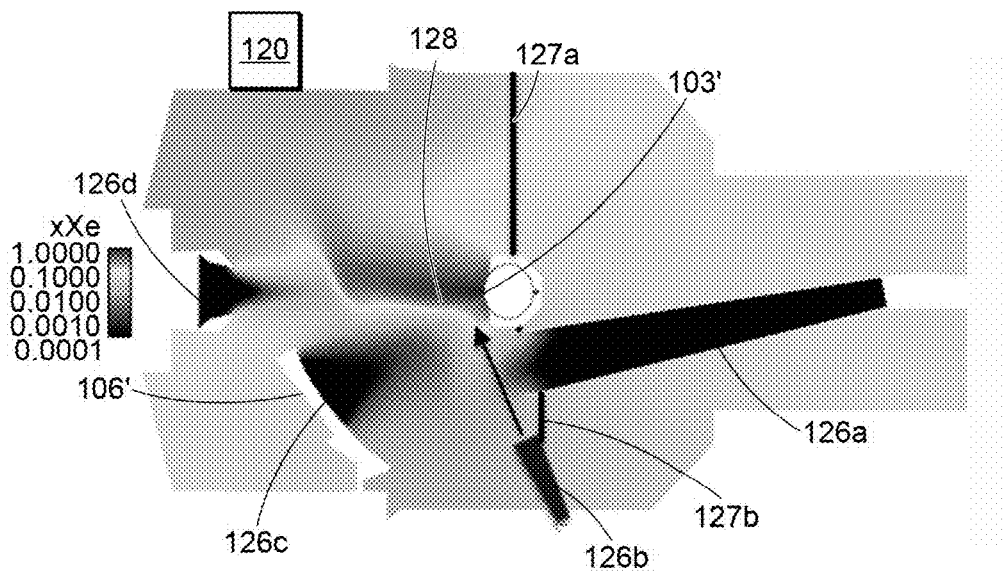
FIG. 1A shows the results of a modeled simulation illustrating the concentration fraction, x, of Xenon in grayscale when a transverse flow is established between the plasma site and collector mirror.

FIG. 1 also shows that outlet 118*a* can cooperate with vacuum pump 120 to produce a transversely directed flow between the collector optic 106 and the plasma site 103 to push target material debris including target material gas and vapor out of the optical pathway. This is illustrated by buffer gas flow arrows 124 in FIG. 1, and is also illustrated in FIG. 1A which shows the results of a modeled simulation illustrating the concentration fraction, x, of Xenon in grayscale when a transverse flow is established between the plasma site 103' and collector optic 106'. As shown in FIG. 1A, darks areas 126*a-d* represent volumes in the chamber having low concentration fractions of Xenon due to buffer gas outlets at the intermediate location flow guide (area 126*a*), transverse outlet corresponding to outlet 118*a* in FIG. 1 (area 126*b*), collector optic outlets (area 126*c*), and laser inlet window outlets (area 126*d*). FIG. 1A illustrates the use of chamber partitions 127*a,b* for establishing a preselected gas flow pattern in the chamber. Gray area 128 represents a volume in the chamber having a relatively high concentration fraction of Xenon that has exited from the plasma site 103' and has been blown transversely out of the optical path by the gas flows established in the chamber.

Figure 1B:
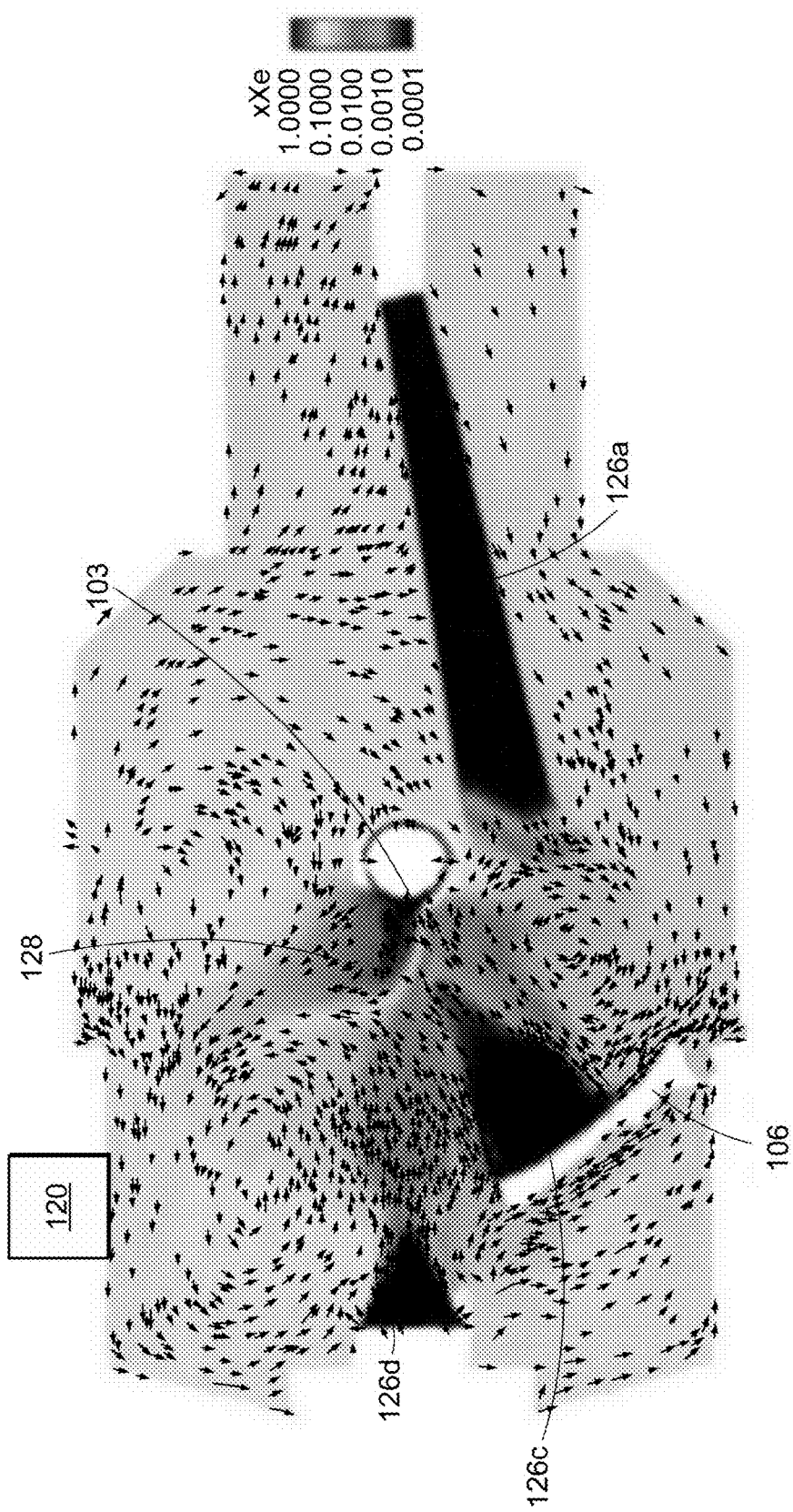
FIG. 1B shows the results of a modeled simulation illustrating the concentration fraction, x, of Xenon in grayscale for selected buffer gas flow rates.

FIG. 1B shows the results of a modeled simulation illustrating the concentration fraction, x, of Xenon in grayscale, for a collector optic 106 located approximately 40 cm from the plasma site 103 (i.e. the xXe scale represents Xe fraction of the gas where "1" means there is only Xenon gas at this location (no Argon) and "0" means there is no Xenon (only Argon). As shown in FIG. 1B, darks areas 126*a, c, d* represent volumes in the chamber having low concentration fractions of Xenon due to buffer gas outlets at the intermediate location flow guide (area 126*a,*), collector optic outlets (area 126*c*) and laser inlet window outlets (area 126*d*). The flows modeled in FIG. 1B are as follows: total Xenon flow required to sustain Xenon ice layer=1.4 slm, Argon flow at laser window outlets=2 slm, Argon flow within the intermediate location flow guide=1 slm, and Argon flow through the collector optic outlets=10.8 slm (13.8 slm total Argon flow). For the model, a steady state pressure of 50 mTorr can be established between the collector optic 106 and plasma site 103 (p*d=50 mTorr*40 cm=2 Torr*cm). Gray area 128 represents a volume in the chamber having a relatively high concentration fraction of Xenon that has exited from the plasma site 103' and been blown transversely out of the optical path by the gas flows established in the chamber. The effect of the collector flow on reducing EUV absorption can be estimated as follows: If Xenon flow is 1.4 slm, total Argon flow is 13.8 slm and chamber pressure is 50 mTorr, then the average partial pressure of Xenon in the chamber can be estimated as 50 mTorr*1.4 slm/13.8 slm~50 mTorr*0.1~5 mTorr. Therefore, for a collector located at 40 cm, the p*d for EUV absorption in Xenon while the light travels from plasma to the collector and back towards the intermediate location (IF) is 5 mTorr*40 cm*2=0.4 Torr*cm. This will result in ~30% loss of EUV during light propagation. Injecting Argon through the collector helps to blow away this Xenon and significantly reduce EUV absorption. In practice, 30% loss is likely to be a low bound estimate for EUV absorption, because Xenon partial pressure near the plasma is above equilibrium concentration (~1.4/13.8=0.1 in this case)—see Xenon jet with xXe partial pressure well above 0.1 near the target. The Argon flow diverts this jet (or Xenon plume) away from the light path between the plasma and the collector thus increasing transmission.

Figure 1C:
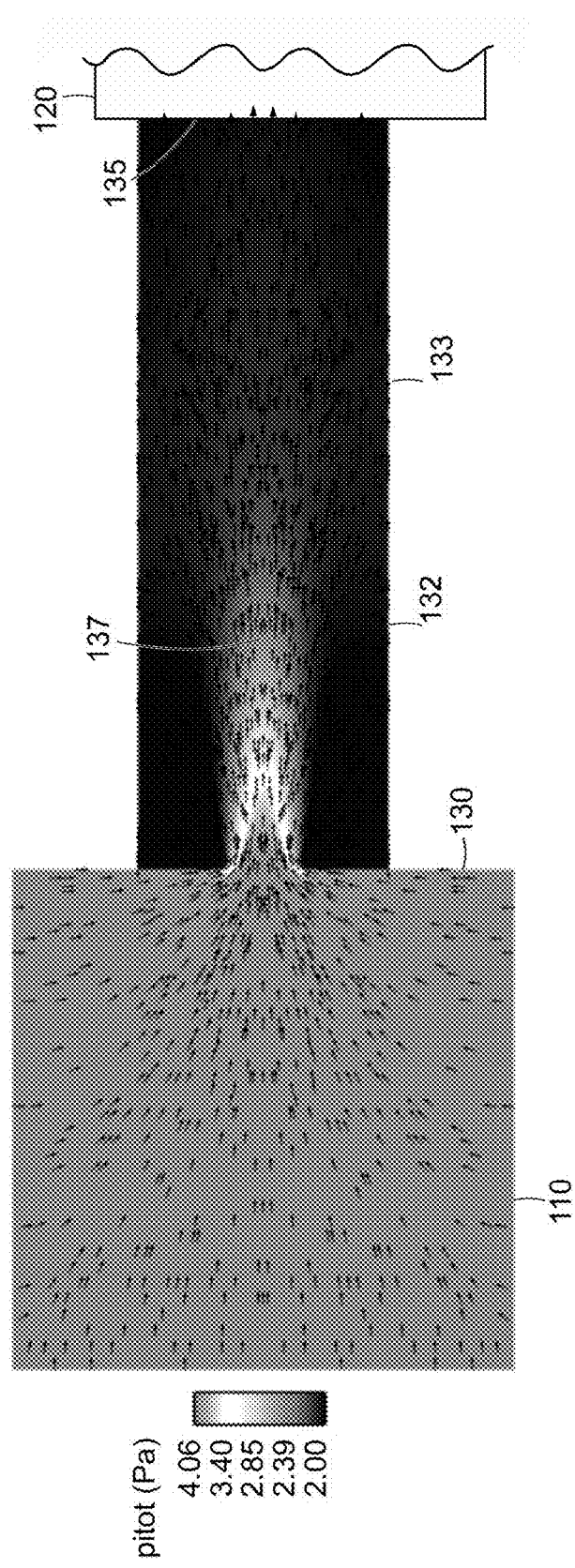
FIG. 1C is a pressure plot showing the results of a modeled simulation and illustrating the flow of gas from a chamber, through a conductance control aperture plate, and into a vacuum pump as seen within detail arrow 1C-1C in FIG. 1.
Figure 1D:
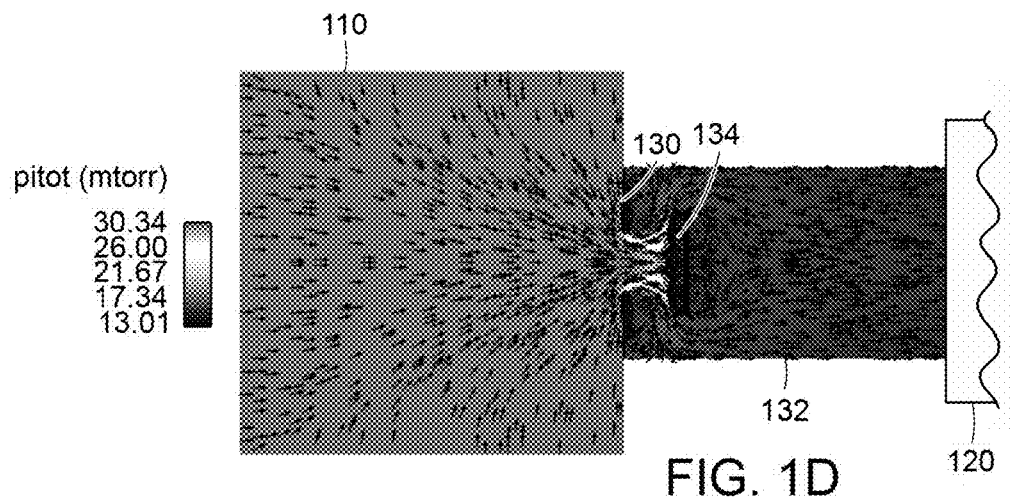
FIG. 1D is a pressure plot showing the results of a modeled simulation and illustrating the flow of gas from a chamber, through a conductance control aperture plate, around a baffle, and into a pump.

FIGS. 1C and 1D illustrate the use of a conductance control aperture plate positioned upstream of the vacuum pump 120 for removing buffer gas from the chamber 110 shown in FIG. 1. More specifically, FIG. 1C is a pressure plot showing the results of a modeled simulation and illustrating the flow of gas from a chamber 110 at a chamber pressure of about 30 mTorr, through a conductance control aperture plate 130, through line 132, at a line pressure of about 13 mTorr, and into vacuum pump 120. The conductance control aperture plate 130 can operate to reduce pressure at the pump inlet (i.e. below chamber pressure) to allow for efficient pump operation. For the devices disclosed herein, the conductance control aperture plate 130 can have a variable aperture that is adjusted manually, or, in some cases by a controller. For example, the variable aperture can be adjusted by a controller responsive to pump inlet pressure.

FIG. 1D is a pressure plot showing the results of a modeled simulation and illustrating the flow of gas from a chamber 110 at a chamber pressure of about 30 mTorr, through a conductance control aperture plate 130, around a baffle 134 in line 132, at a line pressure of about 13 mTorr, and into a vacuum pump 120. The baffle 134 allows for prevention of the jet formation when the gas goes through the aperture (see jet 137 in FIG. 1C), which may be shooting into the vacuum pump 120, causing increased load. As seen by the modeling shown in FIG. 1D, the baffle 134 breaks down the jet from the conductance control aperture plate 130 (shown as jet 137 in FIG. 1C) and makes the flow more uniform. This can become particularly important if the conductance control aperture plate 130 needs to be positioned close to the vacuum pump 120. Instead of, or in addition to a baffle 134, as shown in FIG. 1C the pump inlet 135 can be positioned at a sufficient distance from the conductance control aperture plate 130, e.g. using an inlet extension/spacer 133, to prevent any gas jet 137 formed by the conductance control aperture plate 130 from interfering with the vacuum pump 120.

Figure 1E:
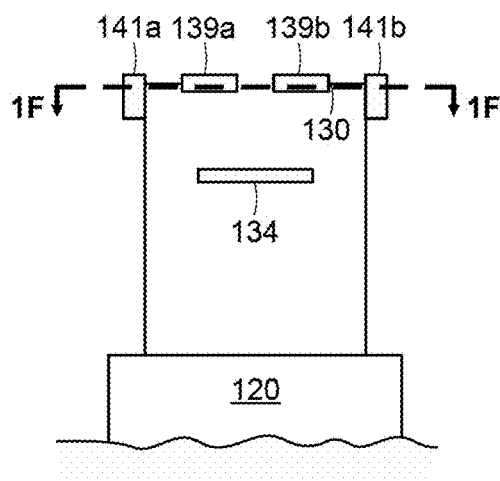
FIG. 1E is a simplified schematic of a subsystem for controlling vacuum pump conductance having a conductance control plate that is formed with an aperture and a mechanism for adjusting the size of the aperture.
Figure 1F:
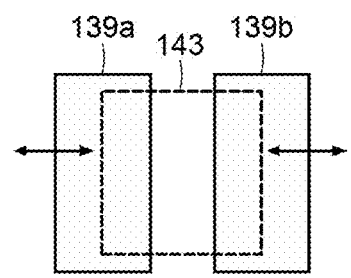
FIG. 1F is a plan view as seen along line 1F-1F in FIG. 1E showing moveable plates for adjusting the size of the aperture.

FIGS. 1E and 1F show a subsystem for controlling vacuum pump conductance having a conductance control plate 130 that is formed with an aperture 143 and a mechanism for adjusting the size of the aperture 143. As shown, the mechanism includes actuators 141a,b, which can be, for example, lead screw assemblies, that are attached to moveable plates 139a,b. The size of the aperture can be adjusted by moving the plates, in response to a control signal to control vacuum pump conductance. The subsystem can be used with a baffle 134 (as shown and described above) or inlet extension spacer (see FIG. 1C and corresponding description). The vacuum pump conductance may be adjusted to maintain the chamber pressure at a preselected target or within a preselected range, for example, when a buffer gas flow or target material gas flow within the chamber is changed. For example, during operation, the flow of Xenon gas used to replenish the frozen Xenon layer may need to be modified. In this case, the vacuum pump conductance can be adjusted to prevent the change in Xenon gas flow from changing the chamber pressure.

Figure 1G:
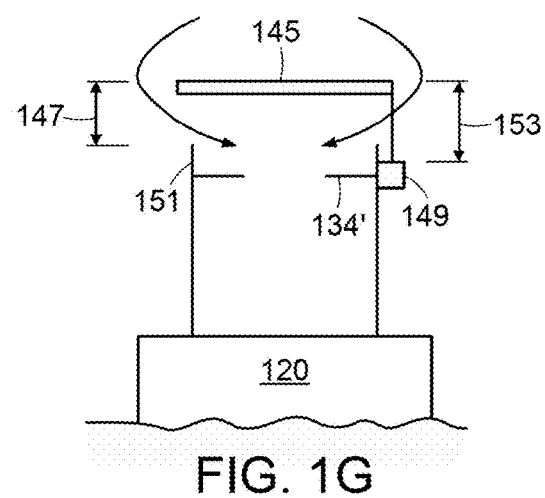
FIG. 1G is a simplified schematic of another embodiment of a subsystem for controlling vacuum pump conductance having a conductance control plate that is spaced from a line inlet to establish a gap between the plate and line inlet and a mechanism for moving the conductance control plate relative to the line inlet to adjust the size of the gap.

FIG. 1G shows another subsystem for controlling vacuum pump conductance having a conductance control plate 145 that is spaced from a line inlet 151 to establish a gap 147 between the plate 145 and line inlet 151 and a mechanism for moving the conductance control plate 145 relative to the line inlet 151 to adjust the size of the gap 147. As shown, the mechanism can include one or more actuators 149, which can be for example, lead screw assemblies, that are attached to plates 145. The size of the gap 147 can be adjusted by moving the plate 145 in the direction of arrow 153, in response to a control signal to control vacuum pump conductance. The subsystem can be used with a baffle 134', as shown, consisting of a plate having an aperture or, alternatively, an inlet extension spacer (see FIG. 1C and corresponding description) to prevent any gas jet formed by the subsystem from interfering with the vacuum pump 120.

Figure 2:
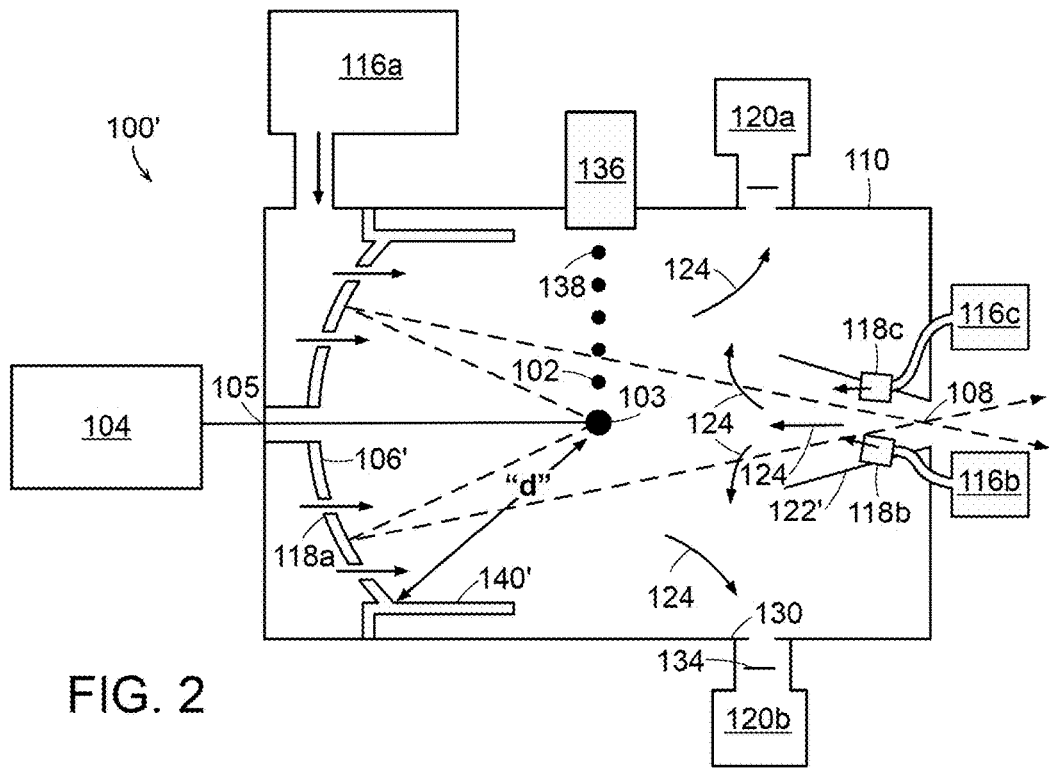
FIG. 2 is a simplified schematic diagram illustrating an LPP light source in which a series of discrete targets (i.e. target material droplets or pellets) are irradiated by a drive laser in which the light source includes an arrangement for controlling gas flows and gas pressures to protect light source components from plasma generated ions and neutrals and for reducing in-band light transmission due to target material gas and vapor in accordance with an embodiment of this disclosure.

FIG. 2 shows another embodiment of an LPP light source 100' which includes target generator 136 that delivers target material 102 to a plasma site 103. The target material 102 can be in the form of a stream or jet (not shown) or a series of discrete targets 138 (i.e. liquid droplets, solid pellets, and/or solid particles contained within liquid droplets). The target material 102 can be irradiated by a excitation source 104 (as described above) to produce a light emitting plasma. As further shown in FIG. 2, the light source 100' includes an arrangement for controlling gas flows and gas pressures to protect light source components from plasma generated ions and neutrals and for reducing in-band light transmission due to target material gas and vapor.

In some embodiments, the light source 100' may further include an emissions controller, which may also include a firing control system for triggering one or more lamps and/or laser devices in the excitation source 104 to generate pulses of illumination for delivery into the chamber 110. The light source 100' may further include a droplet position detection system which may include one or more droplet imagers and/or light curtains configured to indicate the position and/or timing of one or more droplets (e.g. relative to the irradiation region). A droplet position detection feedback system may be configured to receive an output from the droplet images and further configured to compute a droplet position and trajectory, from which a droplet error can be computed (e.g. on a droplet-by-droplet basis or based on an average). The droplet error may then be provided as an input to an excitation source controller, which may be configured to provide a position, direction, and/or timing correction signal to the excitation source 104 to control a source timing circuit and/or to control a beam position and shaping system. Accordingly, the trajectory and/or focal power of the illumination beam or pulses being delivered to the plasma site 103 may be dynamically adjusted according to the droplet position and/or trajectory associated with the target material 102.

FIG. 2 illustrates an embodiment having a symmetrical collector optic 106' having an axis centered on the irradiation path between the laser input window 105 and plasma site 103. As shown, the collector optic 106' is located at a closest distance, "d" from the plasma site 103 and include a central aperture configured to allow illumination from the excitation source 104 to pass through and reach the target material 102 at the plasma site 103.

The light source 100' also includes a tubular flow guide 140' bounding the outer edge of the reflective optic 106' to reduce flow expansion (e.g. prevent gas from expanding outwards beyond the outer edge of the reflective optic 106', where the tubular flow guide 140' may be dimensioned and arranged so that it does not block the optical path).

FIG. 2 shows that the light source 100' can include a flow guide 122' at the intermediate location 108 for directing buffer gas flow from outlets 116a,b to reduce the concentration of target material gas from the optical pathway. For example, the flow guide 122' can be conically shaped and for the setup shown in FIG. 2 which employs a discrete target delivery system, the flow guide 122' can be sized somewhat shorter than the corresponding flow guide 122 shown in FIG. 1 since the flow guide 122' is positioned in plasma line of site (i.e. the shorter flow guide 122' will decrease sputtered debris by increasing the distance from the flow guide 122' to the plasma site 103).

FIG. 2 also shows that outlets 118a-c can cooperate with vacuum pumps 120a,b to produce a directed flow to push target material debris including target material gas and vapor out of the optical pathway. This is illustrated by buffer gas flow arrows 124 in FIG. 2. Moreover, as described above, outlets 118a-c can cooperate with vacuum pumps 120a,b to establish and maintain a flowing gas between the plasma site 103 and the collector optic 106' having an average gas pressure, P, over the distance, "d", sufficient to reduce ion energy to a target maximum energy level (e.g. below 100 eV, and in some cases below 30 eV), before the ions reach the collector optic 106'.

Figure 3:
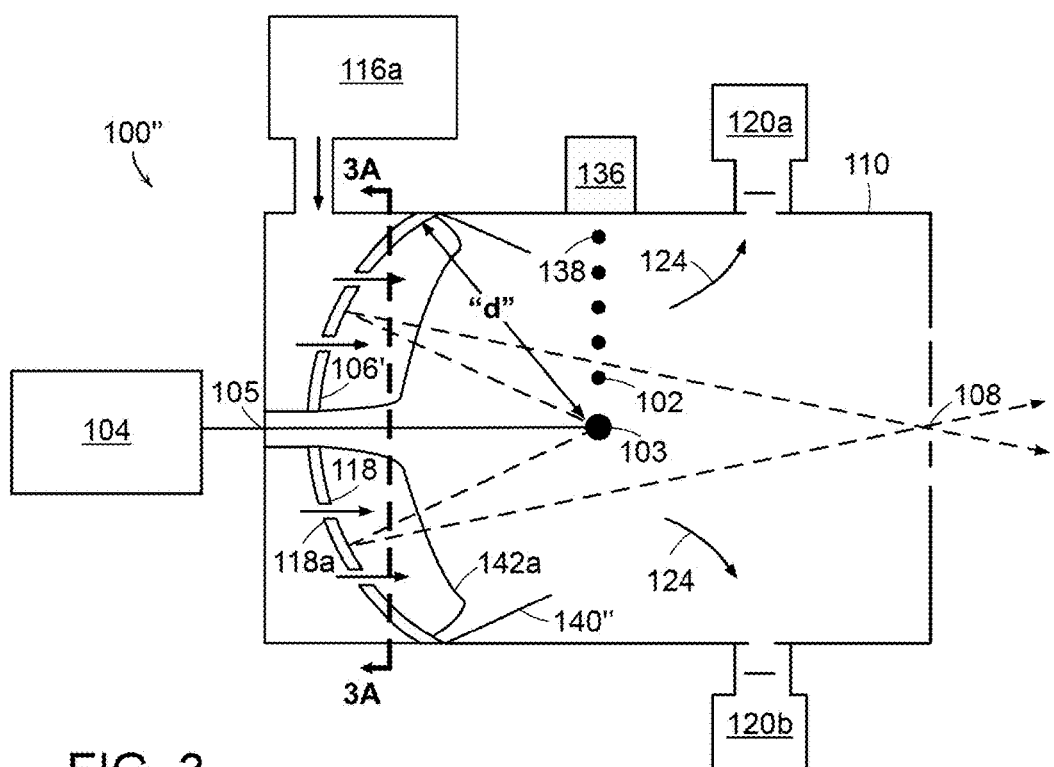
FIG. 3 is a simplified schematic diagram illustrating an LPP light source in which a series of discrete targets (i.e. target material droplets or pellets) are irradiated by a drive laser in which the light source includes an arrangement for controlling gas flows and gas pressures including flow directing vanes to protect light source components from plasma generated ions and neutrals and for reducing in-band light transmission due to target material gas and vapor in accordance with an embodiment of this disclosure.

FIG. 3 shows another embodiment of an LPP light source 100" which includes an arrangement for controlling gas flows and gas pressures to protect light source components from plasma generated ions and neutrals and for reducing in-band light transmission due to target material gas and vapor. Like light source 100' shown in FIG. 2, the light source 100" includes a symmetrical collector optic 106' having an axis centered on the irradiation path between the laser input window 105 and plasma site 103. Also shown, the collector optic 106' is located at a closest distance, "d" from the plasma site 103 and can include a central aperture configured to allow illumination from the excitation source 104 to pass through and reach the target material 102 at the plasma site 103.

The light source 100" shown in FIGS. 3 and 3A also includes one or more vanes (of which vanes 142a-c are labeled) that are positioned between the near normal incidence collector optic 106' and the plasma site 103 to direct flow from the outlet(s) 118. As shown, vanes 142a-c may be radially oriented so that they do not block the optical path. The light source 100" also includes a tubular flow guide 140" bounding the outer edge of the reflective optic 106' to reduce flow expansion (e.g. prevent gas from expanding outwards beyond the outer edge of the reflective optic 106', where the tubular flow guide 140" may be dimensioned and arranged so that it does not block the optical path). The vanes 142a-c, tubular flow guide 140 (FIG. 1), 140' (FIG. 2), 140" (FIG. 3), and/or intermediate location flow guides 122 (FIG. 1), 122' (FIG. 2), can be formed with a rough or textured surface to reduce scattering of stray light (including, for example, IR light from an IR drive laser) from the surfaces which may undesirably pass through the system aperture at the intermediate location.

FIG. 3 also shows that outlet(s) 118 can cooperate with vacuum pumps 120a,b to produce a directed flow to push target material debris including target material gas and vapor out of the optical pathway. This is illustrated by buffer gas flow arrows 124 in FIG. 3. Moreover, as described above, outlet(s) 118 can cooperate with vacuum pumps 120a,b to establish and maintain a flowing gas between the plasma site 103 and the collector optic 106' having an average gas pressure, P, over the distance, "d", sufficient to reduce ion energy to a target maximum energy level (e.g. below 100 eV, and in some cases below 30 eV), before the ions reach the collector optic 106'.

FIG. 4 shows a more detailed view of the target material support system 148 having a rotatable cylindrically-symmetric element 112 depicted in FIG. 1 that is configured to reduce component sputtering/debris generation by eliminating certain support system components that would otherwise be within the line of sight of the plasma and/or increasing the distance between certain support system components and the plasma and/or increasing the angle, a, between certain support system components and the drive laser beam path. For the support system 148, the cylindrically-symmetric element 112 has a surface 150 coated with a band of plasma-forming target material 102 that extends, laterally, around the circumference of the cylindrically-symmetric element 112. The support system 148 also includes a housing 152 overlying and substantially conforming to the surface 150 which can function to protect the band of target material 102 and facilitate the initial generation, maintenance and replenishment of the target material 102 on the surface 150. For the support system, the cylindrically-symmetric element 112 can be internally cooled, for example, using a flow of liquid Nitrogen via line 154. Target material, such as Xenon gas can be injected through the housing 152 onto surface 150 (or passed through the housing 152 and sprayed onto surface 150) to generate and replenish the band of target material 102 (Xenon feed line not shown). More specifically, target material can be sprayed onto surface 150 whereupon it solidifies, for example, to produce a band of frozen Xenon target material 102 extending from a band edge 155 to a band edge 156, the band establishing an operational region of plasma-forming target material 102 within which an interaction between the plasma-forming target material 102 and the output of an excitation source 104 (see FIG. 1) can occur. Shaft 158 is attached to cylindrically-symmetric element 112 and provides a mechanism to rotate the cylindrically-symmetric element 112 about axis 160 and translate the cylindrically-symmetric element 112 along the axis 160. With this arrangement, the band of target material can be moved relative to the drive laser focal spot to sequentially present a series of new target material spots for irradiation. Further details regarding target material support systems having a rotatable cylindrically-symmetric elements are provided in U.S. patent application Ser. No. 14/335,442, titled "System And Method For Generation Of Extreme Ultraviolet Light", to Bykanov et al., filed Jul. 18, 2014, the entire contents of which are hereby incorporated by reference herein.

FIG. 4 also shows that the housing 152 is formed with an opening 162 to expose the plasma-forming target material 102 for irradiation by a drive laser to produce plasma. In more geometrical terms, it can be seen that the opening 162 extends axially beyond the band edges 155, 156 to distance a portion of the housing 152, such as housing edge 157 (which is an edge of the opening 162) from the plasma site 103. It can further be seen that the opening 162 can have a length, $D_{axial}$ in a direction parallel to the axis 160 and a width, $D_{lateral}$ in a direction normal to the axis 160, with $D_{axial} > D_{lateral}$. More specifically, as shown, the housing can have a length, L, parallel to the rotation axis and the opening 162 can extend greater than 50 percent of the length of the housing 152.

FIG. 4 also shows that the opening 162 can extend in the lateral direction from a first edge 164 to a second edge 166. In some cases, each edge 164, 166 can be distanced from the plasma site around the circumference of the cylindrically-symmetric element 112 such that the edge 164, 166 is positioned out of the line of sight of the plasma.

With the geometries described above, the amount of debris generated (e.g. by a plasma that emits ions with energies up to 2.5 keV) can be reduced resulting in improved collector lifetime. In addition to the open face housing having the geometries discussed above, the target supporting flange (which is located in plasma line of sight can be positioned as far from the plasma as practical so that ions generated by the plasma can be stopped by the buffer gas (described above) before they reach the flange. In addition, Applicant measurements, as well as data published in S. Amano et al., Rev. Sci. Instr., 81, 023104 (2010), FIG. 4, indicate that the ion flux drops as angle α w.r.t. the laser axis gets larger. Accordingly, the above described geometries recognize that plasma facing components should be positioned at the largest angles, a, with respect to the laser that are practical (where the ion flux is expected to be weaker) and, if practical, can be made of low erosion materials or coatings such as low sputtering yield materials (e.g. Al, C, B).

FIG. 4A shows an embodiment of a target material support system 148' having a module design including a pair of cover plates 168a,b. As shown, each plate 168a,b overlays a portion of the opening 162 established by the housing 152 and is attached to the housing 152 on each side of the opening 162 by fasteners 170, such as screws. This arrangement allows in situ replacement of a damaged cover plate, e.g. a cover plate damaged by ion erosion. Specifically, the plates 168a,b can be replaced while the target material support system 148' remains installed inside the light source chamber.

Figure 5:
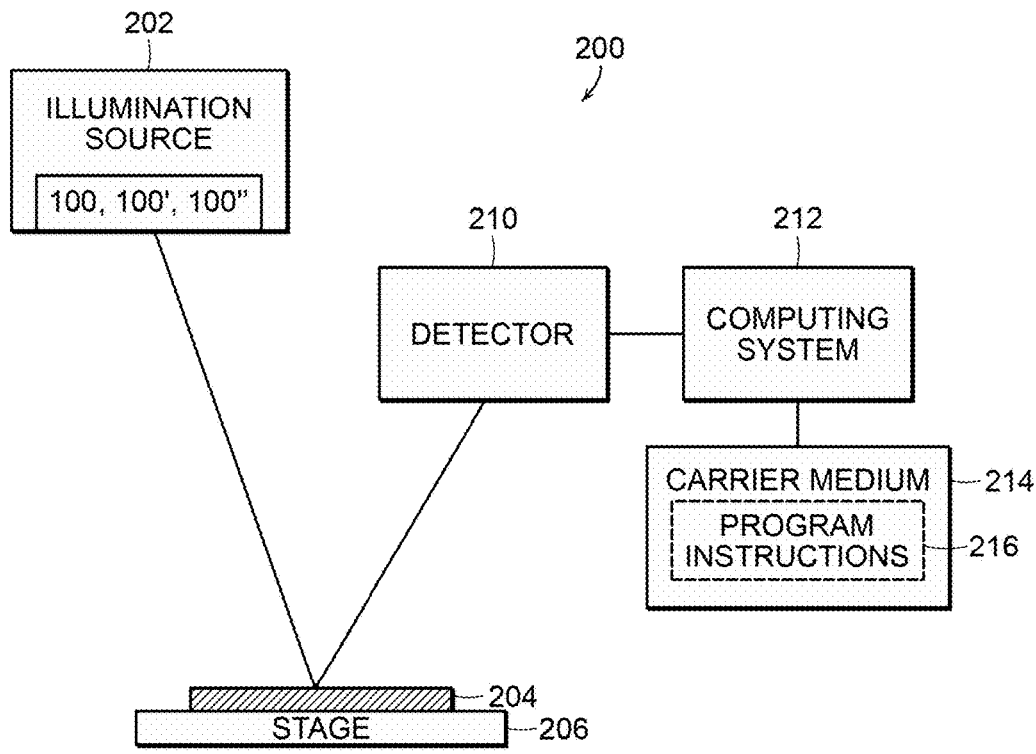
FIG. 5 is a simplified schematic diagram illustrating an inspection system incorporating a light source as disclosed herein.

Soft X-ray, EUV, VUV or any other band of plasma-generated illumination may be used for semiconductor process applications, such as inspection, photolithography, or metrology. For example, as shown in FIG. 5, an inspection system 200 may include an illumination source 202 incorporating a light source, such as one of the light sources 100, 100', 100" described above. The inspection system 200 may further include a stage 206 configured to support at least one sample 204, such as a semiconductor wafer or a mask. The illumination source 202 may be configured to illuminate the sample 204 via an illumination path, and illumination that is reflected, scattered, or radiated from the sample 204 may be directed along an imaging path to at least one detector 210 (e.g. camera or array of photo-sensors). A computing system 212 that is communicatively coupled to the detector 210 may be configured to process signals associated with the detected illumination signals to locate and/or measure various attributes of one or more defects of the sample 204 according to an inspection algorithm embedded in program instructions 216 executable by a processor of the computing system 212 from a non-transitory carrier medium 214.

Figure 6:
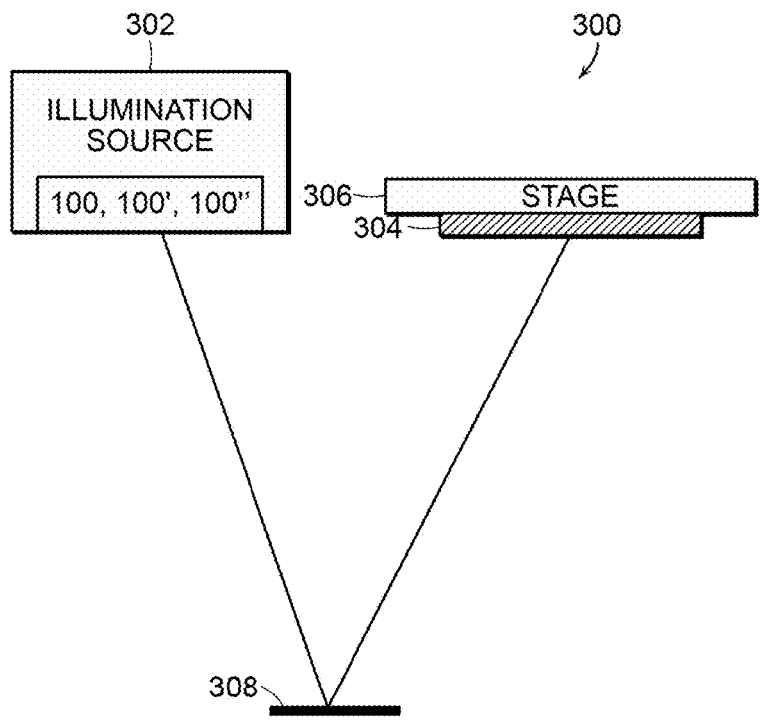
FIG. 6 is a simplified schematic diagram illustrating a lithography system incorporating a light source as disclosed herein.

For further example, FIG. 6 generally illustrates a photolithography system 300 including an illumination source 302 incorporating one of the light sources 100, 100', 100" described above. The photolithography system may include stage 306 configured to support at least one substrate 304, such as a semiconductor wafer, for lithography processing. The illumination source 302 may be configured to perform photolithography upon the substrate 304 or a layer disposed upon the substrate 304 with illumination output by the illumination source 302. For example, the output illumination may be directed to a reticle 308 and from the reticle 308 to the substrate 304 to pattern the surface of the substrate 304 or a layer on the substrate 304 in accordance with an illuminated reticle pattern. The exemplary embodiments illustrated in FIGS. 5 and 6 generally depict applications of the light sources 100, 100', 100" described above; however, those skilled in the art will appreciate that the sources 100, 100', 100" can be applied in a variety of contexts without departing from the scope of this disclosure.

Those having skill in the art will further appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. In some embodiments, various steps, functions, and/or operations are carried out by one or more of the following: electronic circuits, logic gates, multiplexers, programmable logic devices, ASICs, analog or digital controls/switches, microcontrollers, or computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a carrier medium. Program instructions implementing methods such as those described herein may be transmitted over or stored on carrier media. A carrier medium may include a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," "temporarily", or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. A device comprising:
a plasma generating system configured to generate plasma from a target material at a plasma site on a cylindrically-symmetric rotatable element within a chamber;
a component disposed at a selected distance from the plasma site, wherein the component is configured to collect radiation emitted by the plasma and focus the radiation along an optical pathway to an intermediate focus location to form a light cone;
a conical flow guide positioned below the cylindrically-symmetric rotatable element;
a set of gas outlets configured to establish a directional flow of buffer gas forming a gas flow between the plasma and the component, the directional flow of buffer gas establishing an average gas pressure between the component and the plasma sufficient to reduce ion energy below 100 eV before the ions reach the component, wherein the conical flow guide is positioned at least partially coextensive with the light cone formed between the component and the intermediate focus, wherein flow of buffer gas within the conical flow guide displaces target material out of the light cone; and
at least one pump configured to remove gas from the chamber, the pump and outlet configured to reduce target material gas concentration along the optical pathway from the plasma to the intermediate focus.

2. A device as recited in claim 1 wherein the component is a near normal incidence mirror reflecting EUV radiation from the plasma site to the intermediate focus.

3. A device as recited in claim 1 wherein the device further comprises a flow directing structure to direct flow from the at least one outlet.

4. A device as recited in claim 3 wherein the component is a near normal incidence mirror and the flow directing structure comprises at least one vane positioned between the near normal incidence mirror and the plasma site to direct flow from the at least one outlet.

5. A device as recited in claim 3 wherein the flow directing structure comprises a tubular flow guide.

6. A device as recited in claim 1 wherein the radiation includes EUV radiation and the buffer gas has a higher EUV transmission than the target material gas.

7. A device as recited in claim 1 wherein the buffer gas is selected from the group of buffer gases consisting of Hydrogen, Helium, Argon, Nitrogen and combinations thereof.

8. A device as recited in claim 1 wherein the system is a laser produced plasma system having a drive laser irradiating target material coated on a surface of the cylindrically-symmetric rotatable element.

9. A device as recited in claim 1 wherein the system is a laser produced plasma system having a drive laser irradiating target material coated on a surface of a rotatable, cylindrically-symmetric element.

10. A device as recited in claim 1 wherein at least one outlet cooperates with at least one pump to produce a transversely directed flow between the component and the plasma site to push target material gas out of the optical pathway.

11. A device as recited in claim 1 wherein the device further comprises a flow guide at the intermediate focus and wherein at least one outlet directs buffer gas into the flow guide to reduce the concentration of target material gas along the optical pathway.

12. A device as recited in claim 1 wherein the radiation includes EUV radiation having a wavelength of 13.5 nm.

13. A device as recited in claim 1 further comprising a partition in the chamber to establish a preselected gas flow pattern in the chamber.

14. A device comprising:
a plasma generating system configured to generate plasma from a target material at a plasma site on a cylindrically-symmetric rotatable element within a chamber;
a component disposed at a selected distance from the plasma site, wherein the component is configured to collect radiation emitted by the plasma and focus the radiation along an optical pathway to an intermediate focus location to form a light cone;
a conical flow guide positioned below the cylindrically-symmetric rotatable element;
at least one outlet configured to introduce a buffer gas into the chamber and establish a directional flow of buffer gas forming a gas flow, wherein the conical flow guide is at least partially coextensive with the light cone formed between the component and the intermediate focus, wherein flow of buffer gas within the conical flow guide displaces target material out of the light cone; and
at least one pump assembly configured to remove gas from the chamber, the pump assembly having a pump, a conductance control plate positioned upstream of the pump, the pump assembly cooperating with the at least one outlet to establish a flowing gas between the plasma and the component having an average gas pressure between the component and the plasma sufficient to reduce ion energy below 100 eV before the ions reach the component.

15. A device as recited in claim 14 wherein the at least one pump assembly cooperates with the outlet to establish a flowing gas between the plasma and the component having an average gas pressure sufficient to reduce ion energy below 30 eV before the ions reach the component.

16. A device as recited in claim 14 wherein the system produces radiation traveling along an optical pathway toward an intermediate focus, and produces target material gas and ions exiting the plasma and wherein the at least one outlet is configured to receive buffer gas flowing from a fluidically coupled gas source and cooperate with the at least one pump removing gas from the chamber to reduce target material gas concentration along the pathway from the plasma to the intermediate focus.

17. A device as recited in claim 14 wherein the pump has a pump inlet and the conductance control plate operates to establish an inlet pressure at the pump inlet.

18. A device as recited in claim 14 further comprising a baffle positioned between the conductance control plate and the pump to reduce gas jet formation by the conductance control plate.

19. A device as recited in claim 14 further comprising a pump inlet extension positioned between the conductance control plate and the pump to prevent a gas jet formed by the conductance control plate from disrupting the pump.

20. A device as recited in claim 14 wherein the conductance control plate is formed with an aperture.

21. A device as recited in claim 20 further comprising a mechanism for adjusting the size of the aperture.

22. A device as recited in claim 14 wherein the conductance control plate is spaced from a line inlet to establish a gap there between.

23. A device as recited in claim 22 further comprising a mechanism for moving the conductance control plate relative to the line inlet to adjust the size of the gap.

24. A device as recited in claim 14 wherein the radiation includes EUV radiation having a wavelength of 13.5 nm.

25. A device comprising:
a cylindrically-symmetric element rotatable about an axis and having a surface coated with a band of plasma-forming target material, the band extending from a first edge to a second edge and establishing an operational region of plasma-forming target material;
a housing overlying the surface of the cylindrically-symmetric element, wherein the housing substantially conforms to the surface of the cylindrically-symmetric element, wherein the housing includes an opening to allow for exposure of the plasma-forming target material with radiation from a drive laser to produce plasma, the opening extending beyond at least one of the first and second edges of the band to position an edge of the opening by a selected distance from the plasma; and
a conical flow guide positioned below the cylindrically-symmetric rotatable element and positioned at least partially coextensive with a light cone formed between an optical component for receiving and focusing light from the plasma and an intermediate focus of the optical component, wherein a flow of buffer gas within the conical flow guide displaces target material out of the light cone.

26. A device as recited in claim 25 wherein the housing has a length, L, parallel to the axis and the opening extends greater than 50 percent of the length of the housing (Daxial>0.5 L).

27. A device as recited in claim 25 wherein the device further comprises a gas supply subsystem configured to supply plasma-forming target material to the surface of the rotatable, cylindrically-symmetric element.

28. A device as recited in claim 25 wherein the plasma-forming target material on the surface comprises frozen Xenon.

29. A device as recited in claim 25 wherein the device further comprises a mechanism to rotate the cylindrically-symmetric element about the axis and translate the cylindrically-symmetric element along the axis.

30. A device as recited in claim 25 wherein the opening extends in a direction normal to the axis from a first edge to a second edge with each edge positioned out of a line of sight with the plasma.

31. A device as recited in claim 25 wherein the opening has a length, Daxial, in a direction parallel to the axis and a width, Dlateral, in a direction normal to the axis, with Daxial>Dlateral.

32. A device as recited in claim 25 further comprising a cover plate overlying a portion of the opening and attached to the housing on at least one side of the opening with at least one fastener to allow replacement of a damaged cover plate.

33. An EUV light source comprising:
a plasma generating system configured to generate plasma from a Xenon target material at a plasma site on a cylindrically-symmetric rotatable element within a chamber;
a component disposed at a selected distance from the plasma site, wherein the component is configured to collect radiation emitted by the plasma and focus the radiation along an optical pathway to an intermediate focus location to form a light cone;
a conical flow guide positioned below the cylindrically-symmetric rotatable element;
one or more gas outlets configured to establish a directional flow of buffer gas forming a gas cone, the directional flow of buffer gas establishing an average gas pressure between the component and the plasma sufficient to reduce ion energy below 100 eV before the ions reach the component, wherein the conical flow guide is at least partially coextensive with the light cone formed between the component and the intermediate focus, wherein flow of buffer gas within the conical flow guide displaces target material out of the light cone; and
at least one pump removing gas from the chamber, the pump and outlet configured to reduce Xenon target material gas concentration along the optical pathway from the plasma to the intermediate focus.

34. An EUV light source as recited in claim 33 wherein the component is a mirror reflecting EUV radiation from the plasma site to the intermediate focus and wherein the at least one outlet establishes a buffer gas flow rate away from the mirror between 0.5 standard liters per minute (slm) and 20.0 slm.

35. An EUV light source as recited in claim 33 wherein the device further comprises a flow directing structure to direct flow from the at least one outlet.

36. An EUV light source as recited in claim 35 wherein the component is a mirror reflecting EUV radiation from the plasma site to the intermediate focus and wherein the flow directing structure comprises at least one vane positioned between the mirror and the plasma site to direct flow from at least one outlet.

37. An EUV light source as recited in claim 35 wherein the flow directing structure comprises a tubular flow guide.

38. An EUV light source as recited in claim 33 wherein the buffer gas is selected from the group of buffer gases consisting of Hydrogen, Helium, Argon, Nitrogen and combinations thereof.

39. An EUV light source as recited in claim 33 wherein the system is a laser produced plasma system having a drive laser irradiating Xenon target material coated on a surface of the cylindrically-symmetric rotatable element.

40. An EUV light source as recited in claim 33 wherein the system is a laser produced plasma system having a drive laser irradiating Xenon target material coated on a surface of a rotatable, cylindrically-symmetric element.

41. An EUV light source as recited in claim 33 wherein at least one outlet cooperates with at least one pump to produce a transversely directed flow between the component and the plasma site to push Xenon target material gas out of the optical pathway.

42. An EUV light source as recited in claim 33 wherein the device further comprises a flow guide at the intermediate focus and wherein at least one outlet directs buffer gas into the flow guide to reduce the concentration of Xenon target material gas along the optical pathway.

43. An EUV light source as recited in claim 33 wherein the radiation includes EUV radiation having a wavelength of 13.5 nm.

44. An EUV light source as recited in claim 33 further comprising a partition in the chamber to establish a preselected gas flow pattern in the chamber.

45. An EUV light source as recited in claim 33 wherein the buffer gas has a higher EUV transmission than the Xenon target material gas.

* * * * *